United States Patent [19]

Katz

[11] Patent Number: 5,134,245
[45] Date of Patent: Jul. 28, 1992

[54] LAP-TOP COMPUTER OPERATORS PROTECTIVE DEVICE

[76] Inventor: Joseph M. Katz, 11 Meadow Rd., Old Westbury, N.Y. 11568

[21] Appl. No.: 708,222

[22] Filed: May 31, 1991

[51] Int. Cl.⁵ .............................................. H05K 9/00
[52] U.S. Cl. .......................... 174/35 R; 174/35 MS; 361/424
[58] Field of Search ...................... 174/35 R, 35 MS; 219/10.55 D, 10.55 R; 361/424

[56] References Cited

U.S. PATENT DOCUMENTS

| | | | |
|---|---|---|---|
| 4,853,790 | 8/1989 | Dickie | 358/245 |
| 4,890,199 | 12/1989 | Beutler | 361/414 |
| 5,014,160 | 5/1991 | McCoy, Jr. | 361/424 |

Primary Examiner—Leo P. Picard
Assistant Examiner—Bot Lee Ledynh

[57] ABSTRACT

A low cost non-electric device to afford some protection to the operators of lap top computers from the electromagnetic fields emitted therefrom and to provide a comfortable cushion to rest the computer upon.

1 Claim, 1 Drawing Sheet

LAP-TOP COMPUTER OPERATORS PROTECTIVE DEVICE

BACKGROUND OF THE INVENTION

1. Field of the Invention

The invention relates to providing some protection to the operators of lap top computers from the electromagnetic fields emitted therefrom and to afford a comfortable cushion when the lap top computer is being used.

2. Description of the Prior Art

There is no similar prior art for the same purpose.

SUMMARY OF THE INVENTION

There is much concern throughout the world that electromagnetic fields can cause genetic defects, cancer and other bodily harms, especially so when in close contact with the body.

The lap top computer has become very popular with executives and travelling business persons since they can sit in an airplane seat, and automobile, a train and the like, put the computer upon their lap and utilize travelling time to get work done, play games or otherwise amuse themselves to pass time away.

Also, since the lap top computer is small and compact, many use it at a work station. However, since the screen is small and the writing screen thereon is dull, the operators have a tendency to bend over close to the computer and expose themselves to emitted electromagnetic fields.

The lap top computer, being electric, emits electromagnetic fields. The fact that being placed on the lap and in close contact to critical genetic and bodily organs, the danger is apparent. Furthermore, the weight of the computer causes uncomfortableness. Also, at the workstation, the danger of the close body contact is a hazard.

Because of the hazards and uncomfortableness, this device was invented. Its purpose is to provide a one piece light weight portable unit with comfortable cushion to rest the lap top computer upon as well as to ground the electromagnetic fields so that they by-pass the computer operator, thereby providing some protection to the genetic and bodily organs. Portability, light weight, protection, comfort and separability are all functions of the device.

The device is simple to use. It is manufactured into a single one piece unit consisting of a light weight, firm material, box-like open at the top tray, with a cushion at the bottom. It has a grounding receptacle and separate grounding wire with clamps and plugs.

The size of the device is manufactured to conform to the measurements of every lap top computer maunufacturer's specifications.

To use the device, the lap top computer operator simply places the lap top computer into the box-like tray, uses the attached thumb screws to tighten the lap top computer into the device and places the lap top computer either on their lap or work station or other convenient place. If the operator wishes to utilize the electromagnetic field protection, the separate grounding wire is attached to the device on one end and a ground on the other end, using the plugs and clamps supplied with the device. If the lap top computer operator just wishes to use the device as a comfortable resting device, the operator simply places the unit where desired without the use of the grounding wire.

BRIEF DESCRIPTION OF THE DRAWINGS

The computer 1. The keyboard 2. The image screen 3. The computer hinge 4. The tray 5. The cushion 6. The aluminum foil 7. The ground connection on tray 8. The ground connection on cushion 9. The tray to cushion grounding wire 10. The grounding wire for spring clamp 11. The spring clamp 12. The alternate ground plug 13. The alternate ground wire for the ground plug 14. The grounding connection for the alternate grounding plug 15. The grounding fixture on the tray for ground plug or spring clamp attachment 16. Thumb screws to hold lap-top computer when inserted into the device 17.

DESCRIPTION OF THE PREFERRED EMBODIMENTS

Figure 1:
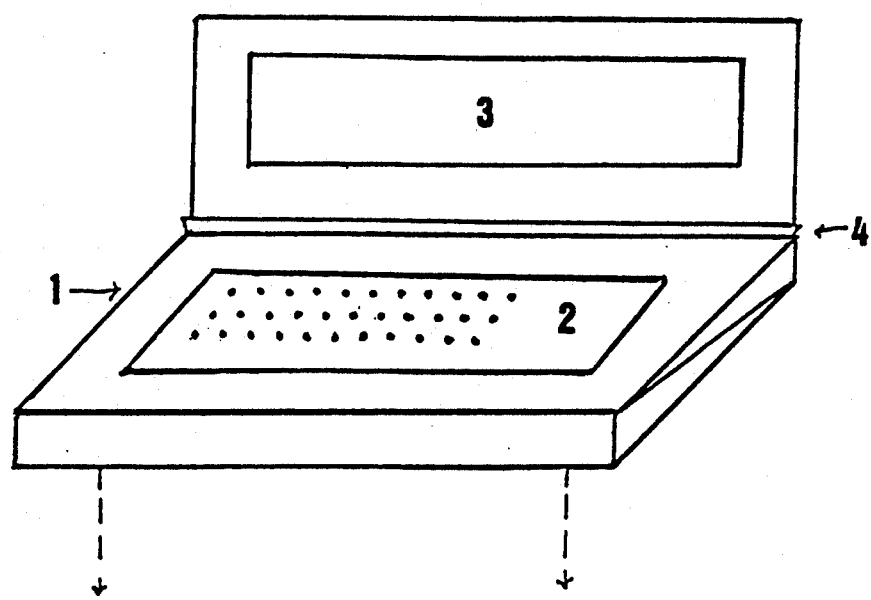
FIG. 1 is an isometric view of a lap-top computer.
Figure 2:
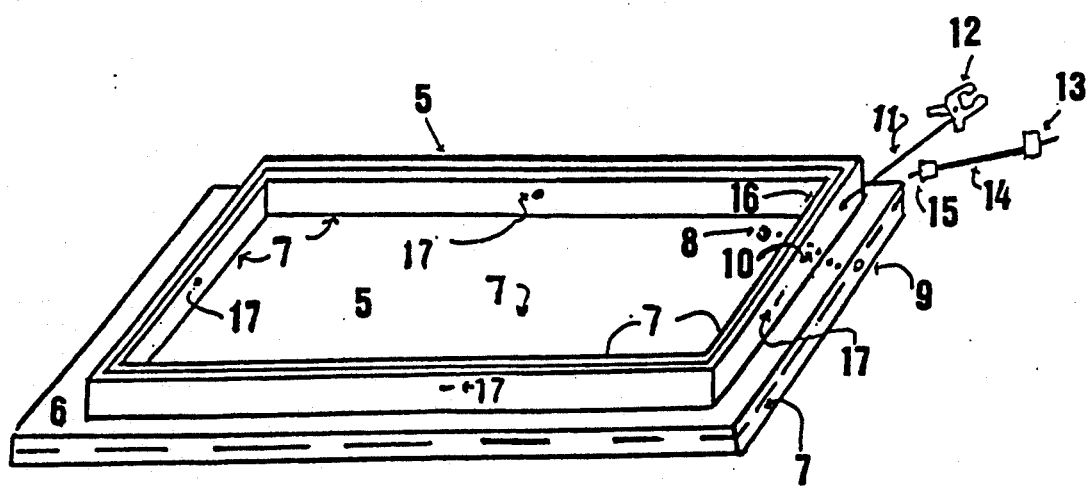
FIG. 2 is an isometric view of an assembly of the present invention.

The invention consists of an open tray with 4 upright sides. The tray rests upon 2 flat cushions. The tray is affixed to the cushions to form 1 piece. Aluminum foil is placed on the flat base of the tray and run up along the sides of the tray. The cushion is 2 comfortable horizontal pieces with aluminum foil between the pieces. The aluminum on the base of the tray is grounded to the aluminum between the cushions. A grounding socket is attached to the aluminum on the side of the tray and extends through the side to a grounding clamp on the outside where a grounding wire with attached spring clamp is affixed. The spring clamp is interchangeable with a single pole insulated plug. The computer is placed into the tray and the spring clamp is attached to a ground. The single insulated plug may be substituted for the spring clamp and plugged into the ground opening of an electric socket. Thumb screws on all sides of the device hold the lap-top computer firmly in place when it is inserted into the device.

The function of the device is to capture the electromagnetic fields from the computer by the aluminum foil and redirect them through the grounding wire and clamp, or plug, away from the operator, thereby providing some protection to the operator from the direct electromagnetic fields and the cushion provides comfortability to the operator when the unit is placed on the lap. Also, portability, light weight, protection, comfort and separability are functions of the device while various changes may be made in the detailed construction, such changes will be within the spirit and scope of the present invention, as defined by the appended claims.

I claim:

1. An assembly for attenuating the passage of electromagnetic energy emitted from a lap-top computer, said assembly comprising:
   (a) a tray having a base and upright sides;
   (b) a first aluminum foil being placed on said base and a second aluminum foil being placed along said upright sides;
   (c) a cushion having two horizontal pieces with a third aluminum foil between said two pieces, said cushion being integrally fastened to said base;
   (d) a first grounding connector being connected to said first aluminum foil, a second grounding connector being connected to said second aluminum foil, a third grounding connector being connected to said third aluminum foil, said second grounding connector being made to penetrate an upright side through a hole; and
   (e) grounding wires being attached to said grounding connectors to form a circuit.

* * * * *